(12) United States Patent
Shin et al.

(10) Patent No.: US 12,334,704 B2
(45) Date of Patent: Jun. 17, 2025

(54) TUNABLE LASER SOURCE AND LIGHT STEERING APPARATUS INCLUDING THE SAME

(71) Applicant: SAMSUNG ELECTRONICS CO., LTD., Suwon-si (KR)

(72) Inventors: Dongjae Shin, Seoul (KR); Hyunil Byun, Seongnam-si (KR); Changgyun Shin, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/663,971

(22) Filed: May 14, 2024

(65) Prior Publication Data

US 2024/0305058 A1  Sep. 12, 2024

Related U.S. Application Data

(62) Division of application No. 17/095,435, filed on Nov. 11, 2020, now Pat. No. 12,015,237.

(30) Foreign Application Priority Data

Jun. 3, 2020 (KR) .......................... 10-2020-0067314

(51) Int. Cl.
*H01S 3/10*  (2006.01)
*H01S 3/063*  (2006.01)
(Continued)

(52) U.S. Cl.
CPC ........ *H01S 3/10023* (2013.01); *H01S 3/0637* (2013.01); *H01S 5/0071* (2013.01);
(Continued)

(58) Field of Classification Search
CPC ....................................................... H01S 5/142
See application file for complete search history.

(56) References Cited

U.S. PATENT DOCUMENTS 5,321,501 A * 6/1994 Swanson ............ G01B 9/02019
356/73.1
5,500,762 A * 3/1996 Uchiyama .......... H04B 10/2572
359/348
(Continued)

FOREIGN PATENT DOCUMENTS

CN           1862898 A     11/2006
CN       104466620 A      3/2015
(Continued)

OTHER PUBLICATIONS

Paschotta, "Standing-Wave Resonators," RP Photonics Encyclopedia, <https://www.rp-photonics.com/standing_wave_resonators.html>, [retrieved Jan. 9, 2025]. (Year: 2025).*
(Continued)

*Primary Examiner* — Joshua King
(74) *Attorney, Agent, or Firm* — Sughrue Mion, PLLC

(57) ABSTRACT

Provided is a tunable laser source including a plurality of optical waveguides, at least three optical resonators provided between the plurality of optical waveguides and optically coupled to the plurality of optical waveguides, the at least three optical resonators having different lengths, and at least one optical amplifier provided on at least one of the plurality of optical waveguides, wherein a ratio of a first length of a first optical resonator of the at least three optical resonators to a second length of a second optical resonator of the at least three optical resonators is not an integer.

2 Claims, 14 Drawing Sheets

(51) Int. Cl.
*H01S 3/08031* (2023.01)
*H01S 3/082* (2006.01)
*H01S 3/083* (2006.01)
*H01S 3/106* (2006.01)
*H01S 5/00* (2006.01)
*H01S 5/02* (2006.01)
*H01S 5/06* (2006.01)
*H01S 5/065* (2006.01)
*H01S 5/14* (2006.01)
*G01S 7/481* (2006.01)

(52) U.S. Cl.
CPC .......... *H01S 5/0612* (2013.01); *H01S 5/0654* (2013.01); *H01S 5/142* (2013.01); *G01S 7/4814* (2013.01); *G01S 7/4817* (2013.01); *H01S 3/08031* (2013.01); *H01S 3/082* (2013.01); *H01S 3/0826* (2013.01); *H01S 3/083* (2013.01); *H01S 3/106* (2013.01); *H01S 5/021* (2013.01); *H01S 5/0218* (2013.01)

(56) References Cited

U.S. PATENT DOCUMENTS

| | | | |
|---|---|---|---|
| 6,853,671 | B2 | 2/2005 | Liu et al. |
| 7,683,308 | B2 | 3/2010 | Charbon et al. |
| 7,719,029 | B2 | 5/2010 | Itzler |
| 7,773,642 | B2 | 8/2010 | Yamazaki |
| 8,040,586 | B2 | 10/2011 | Smith et al. |
| 8,643,943 | B2 * | 2/2014 | Todt ............... H01S 5/141 359/333 |
| 8,767,190 | B2 | 7/2014 | Hall |
| 9,110,158 | B2 | 8/2015 | Habif |
| 9,130,350 | B2 | 9/2015 | Jeong |
| 9,270,078 | B2 | 2/2016 | Rickman et al. |
| 9,632,216 | B2 | 4/2017 | Han et al. |
| 9,748,726 | B1 | 8/2017 | Morton et al. |
| 9,755,753 | B2 * | 9/2017 | Blumenthal ......... H01S 5/0085 |
| 10,031,310 | B2 * | 7/2018 | Yamazaki ............ H01S 5/1032 |
| 10,132,928 | B2 | 11/2018 | Eldada et al. |
| 10,170,888 | B2 | 1/2019 | Zheng et al. |
| 10,243,328 | B2 | 3/2019 | Zhang et al. |
| 10,312,663 | B2 | 6/2019 | Takabayashi et al. |
| 10,613,410 | B2 | 4/2020 | Hosseini et al. |
| 11,239,635 | B2 * | 2/2022 | Liu ................. H01S 5/142 |
| 2002/0197013 | A1 | 12/2002 | Liu et al. |
| 2003/0219045 | A1 * | 11/2003 | Orenstein ............ H01S 5/1032 372/20 |
| 2004/0114658 | A1 * | 6/2004 | Stegmuller .......... H01S 5/1071 372/97 |
| 2005/0058396 | A1 * | 3/2005 | Tormen .............. G02F 1/3132 385/27 |
| 2006/0153267 | A1 * | 7/2006 | Suzuki ................ H01S 5/142 372/92 |
| 2006/0198401 | A1 * | 9/2006 | Suzuki ................ H01S 5/142 372/29.016 |
| 2006/0222038 | A1 * | 10/2006 | Yamazaki ............ H01S 5/1032 372/94 |
| 2008/0056311 | A1 * | 3/2008 | Takeuchi ............ H01S 5/141 372/20 |
| 2008/0165366 | A1 * | 7/2008 | Schmitt .............. G01B 9/02004 356/519 |
| 2008/0187268 | A1 * | 8/2008 | Kaneko ............... G02B 6/4215 385/27 |
| 2008/0232409 | A1 * | 9/2008 | Yamazaki ........... G02B 6/12004 372/20 |
| 2008/0240646 | A1 * | 10/2008 | Yamazaki ........... G02B 6/12007 385/14 |
| 2009/0154505 | A1 * | 6/2009 | Oh ..................... G02B 6/12007 372/20 |
| 2009/0174931 | A1 * | 7/2009 | Huber ................. H01S 3/06791 372/18 |
| 2009/0285251 | A1 * | 11/2009 | Yamazaki ............ H01S 5/141 372/29.014 |
| 2010/0246612 | A1 * | 9/2010 | Shimizu ............. H01S 5/0602 372/18 |
| 2010/0254416 | A1 * | 10/2010 | Suzuki .............. H01S 5/0687 372/20 |
| 2010/0284649 | A1 * | 11/2010 | Ishii .................. H01S 5/0687 385/31 |
| 2011/0013654 | A1 * | 1/2011 | Yamazaki ........... H01S 5/0687 372/29.02 |
| 2011/0038036 | A1 | 2/2011 | Todt |
| 2012/0236883 | A1 * | 9/2012 | Adler ................. G01B 9/02069 372/20 |
| 2013/0221211 | A1 * | 8/2013 | Witzens .............. H04B 10/60 250/216 |
| 2013/0322807 | A1 * | 12/2013 | Aflatouni ........... H04B 10/671 385/3 |
| 2014/0139900 | A1 | 5/2014 | Shin et al. |
| 2014/0140652 | A1 * | 5/2014 | Aflatouni ........... G02F 1/011 385/3 |
| 2014/0153601 | A1 * | 6/2014 | Doerr ................ H01S 5/125 372/44.01 |
| 2014/0232827 | A1 | 8/2014 | Kumar et al. |
| 2015/0016767 | A1 * | 1/2015 | Akiyama ............ G02F 1/225 385/3 |
| 2015/0180201 | A1 * | 6/2015 | Zhang ................ H01S 3/005 372/20 |
| 2015/0207291 | A1 | 7/2015 | Rickman et al. |
| 2015/0222089 | A1 * | 8/2015 | Jeong ................ H01S 5/14 359/346 |
| 2015/0333475 | A1 * | 11/2015 | Blumenthal ......... H01S 5/0206 372/27 |
| 2016/0049767 | A1 * | 2/2016 | Morton ............... H01S 5/142 372/99 |
| 2016/0156149 | A1 * | 6/2016 | Takabayashi ....... H01S 5/142 372/6 |
| 2016/0209499 | A1 | 7/2016 | Suzuki |
| 2016/0209593 | A1 | 7/2016 | Jiang |
| 2017/0098921 | A1 * | 4/2017 | Takabayashi ....... H01S 5/1071 |
| 2017/0180658 | A1 | 6/2017 | Choi et al. |
| 2017/0301716 | A1 | 10/2017 | Irish et al. |
| 2017/0324218 | A1 * | 11/2017 | Krishnamoorthy ........ H01S 3/10 |
| 2017/0353001 | A1 | 12/2017 | Takabayashi |
| 2017/0353007 | A1 * | 12/2017 | Kobayashi .......... H01S 5/026 |
| 2017/0353008 | A1 * | 12/2017 | Sugiyama .......... H01S 5/142 |
| 2018/0031681 | A1 | 2/2018 | Yoon et al. |
| 2018/0226767 | A1 * | 8/2018 | Takabayashi ....... G01J 1/4257 |
| 2018/0231807 | A1 | 8/2018 | Zheng et al. |
| 2018/0261976 | A1 * | 9/2018 | Menezo ............... H01S 5/0687 |
| 2018/0269654 | A1 * | 9/2018 | Zhang ................ H01S 5/1096 |
| 2018/0309266 | A1 * | 10/2018 | Nakano .............. H01S 5/021 |
| 2019/0056634 | A1 | 2/2019 | Hosseini et al. |
| 2019/0187257 | A1 | 6/2019 | Otsuka et al. |
| 2019/0199062 | A1 * | 6/2019 | Ma ................... H01S 5/06821 |
| 2019/0391459 | A1 | 12/2019 | Shin et al. |
| 2020/0049819 | A1 | 2/2020 | Cho et al. |
| 2020/0103679 | A1 | 4/2020 | Lee et al. |
| 2020/0144782 | A1 | 5/2020 | Oda |
| 2020/0174104 | A1 | 6/2020 | Kim et al. |
| 2021/0255006 | A1 * | 8/2021 | Hassan ............... H01S 5/10 |

FOREIGN PATENT DOCUMENTS

| | | | | |
|---|---|---|---|---|
| CN | 106229805 | A * | 12/2016 | ......... H01S 3/067 |
| CN | 112787214 | A | 5/2021 | |
| JP | 9-211128 | A | 8/1997 | |
| JP | 3089253 | B2 | 9/2000 | |
| JP | WO2005/096462 | A1 | 10/2005 | |
| JP | 2010-27664 | A | 2/2010 | |
| JP | 2017098362 | A * | 6/2017 | |
| KR | 10-2006-0105506 | A | 10/2006 | |
| KR | 10-0816578 | B1 | 3/2008 | |
| KR | 10-2014-0075821 | A | 6/2014 | |
| KR | 10-2019-0143224 | A | 12/2019 | |
| KR | 10-2020-0037639 | A | 4/2020 | |
| KR | 10-2020-0066947 | A | 6/2020 | |
| WO | WO-2005096462 | A1 * | 10/2005 | ......... G02B 6/12004 |

(56) References Cited

FOREIGN PATENT DOCUMENTS

WO        2018/128662 A2     7/2018
WO     WO-2019191647 A1 * 10/2019    ......... G02F 1/3536

OTHER PUBLICATIONS

Youwen Fan et al., "Ultra-narrow linewidth hybrid integrated semiconductor laser", physics.optics, arXiv:1910.08141v1, Oct. 21, 2019, pp. 1-13, 13 pages total.
John E. Bowers, "Integrated Microwave Photonics", IEEE, 2015, 3 pages total.
J. C. Hulme et al., "Widely tunable Vernier ring laser on hybrid silicon", Optics Express, vol. 21, No. 17, DOI:10.1364/OE.21.019718, Aug. 14, 2013, pp. 19718-19722, 5 pages total.
Communication dated May 10, 2021 issued by the European Patent Office in European Application No. 20207506.5.
Komljenovic et al., "Monolithically Integrated High-Q Rings for Narrow Linewidth Widely Tunable Lasers," Nov. 2015, IEEE Journal of Quantum Electronics, vol. 51, No. 11, 0600610, 1-10. (Year: 2015).
Communication dated Jan. 16, 2025, issued by Korean Intellectual Property Office in Korean Patent Application No. 10-2020-0067314.
Office Action issued on Mar. 29, 2025 by the China National Intellectual Property Administration in Chinese Patent Application No. 202011226483.9.

\* cited by examiner

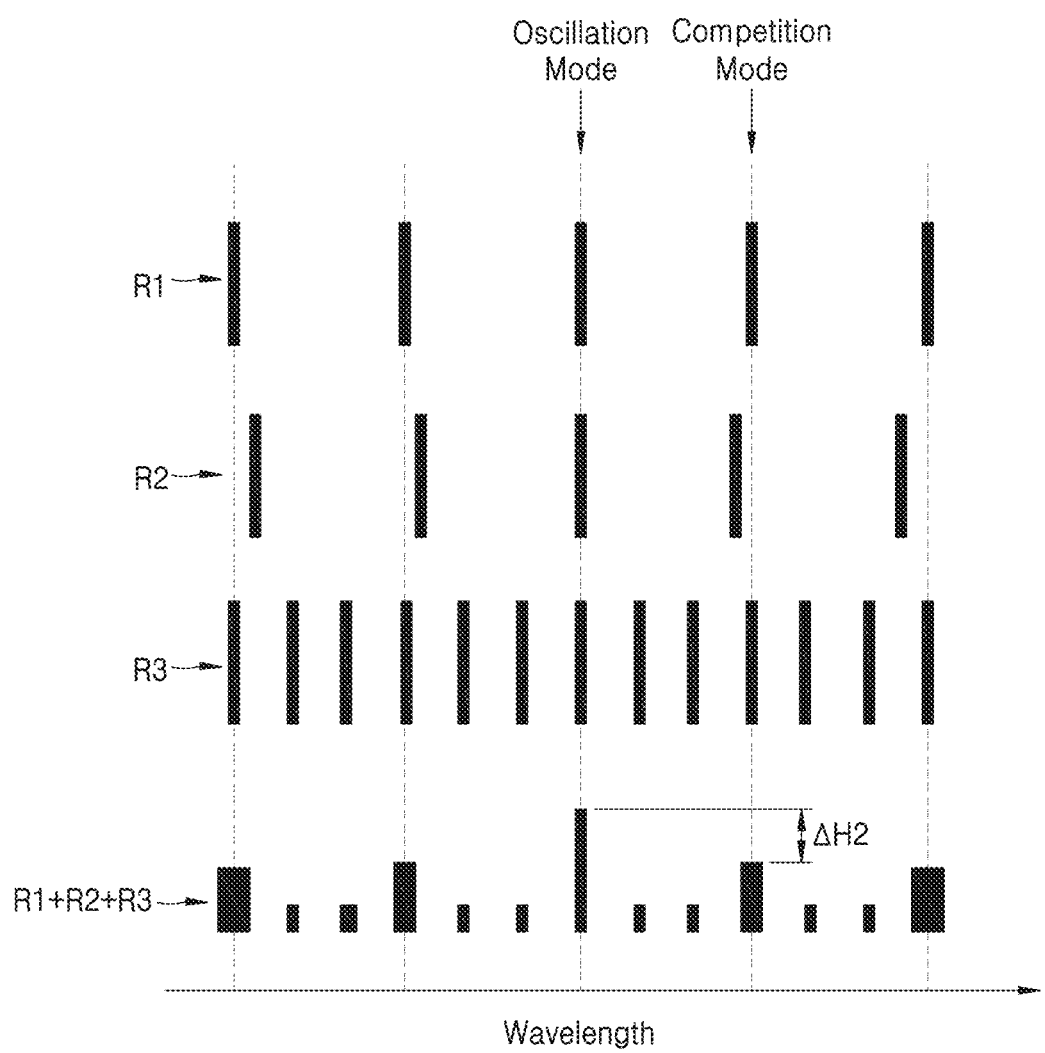

TUNABLE LASER SOURCE AND LIGHT STEERING APPARATUS INCLUDING THE SAME

CROSS-REFERENCE TO RELATED APPLICATION

This present application is a divisional of U.S. application Ser. No. 17/095,435 filed Nov. 11, 2020, which claims priority to Korean Patent Application No. 10-2020-0067314, filed on Jun. 3, 2020, in the Korean Intellectual Property Office, the disclosures of which are incorporated by reference herein in their entireties.

BACKGROUND

1. Field

Example embodiments of the present disclosure relate to tunable laser sources and light steering apparatuses including the tunable laser sources.

2. Description of Related Art

In an integrated optical circuit in which optical elements are integrated, a light source is an important component. Light sources may be classified into a single wavelength type and a variable wavelength type (tunable type), and in particular, there is increasing interest in tunable laser sources as light sources for light steering apparatuses such as light detection and ranging (LiDAR) apparatuses. When a single wavelength light source is used as a light source of a light steering apparatus, an antenna array in which antennas are two-dimensionally arranged is required for two-dimensional optical scanning. However, when a tunable light source is used as a light source of a light steering apparatus, two-dimensional optical scanning is possible using an antenna array in which antennas are one-dimensionally arranged.

SUMMARY

One or more example embodiments provide tunable laser sources and light steering apparatuses including the tunable laser sources.

Additional aspects will be set forth in part in the description which follows and, in part, will be apparent from the description, or may be learned by practice of example embodiments.

According to an aspect of an example embodiment, there is provided a tunable laser source including a plurality of optical waveguides, at least three optical resonators provided between the plurality of optical waveguides and optically coupled to the plurality of optical waveguides, the at least three optical resonators having different lengths, and at least one optical amplifier provided on at least one of the plurality of optical waveguides, wherein a ratio of a first length of a first optical resonator of the at least three optical resonators to a second length of a second optical resonator of the at least three optical resonators is not an integer.

The at least three optical resonators may include a first ring resonator having a first circumference length, a second ring resonator having a second circumference length that is greater than the first circumference length, and a third ring resonator having a third circumference length that is greater than the second circumference length.

A first ratio of the third circumference length to the first circumference length or a second ratio of the third circumference length to the second circumference length may not be an integer.

The first ratio of the third circumference length to the first circumference length or the second ratio of the third circumference length to the second circumference length may be a rational number having two or more digits after a decimal point.

The first ratio of the third circumference length to the first circumference length or the second ratio of the third circumference length to the second circumference length may be an irrational number.

A difference between the first circumference length and the second circumference length may be 1% to 10% of the first circumference length.

The tunable laser source may further include controllers respectively provided at the first ring resonator, the second ring resonator, and the third ring resonator, the controllers being configured to respectively adjust refractive indexes of the first ring resonator, the second ring resonator, and the third ring resonator.

The tunable laser source may further include at least one optical delay line provided on at least one of the plurality of optical waveguides.

The tunable laser source may further include at least one optical delay line provided on at least one of the first ring resonator, the second ring resonator, and the third ring resonator.

The tunable laser source may further include a fourth ring resonator optically coupled to the third ring resonator, wherein a size of the fourth ring resonator is equal to a size of the third ring resonator.

The tunable laser source may further include at least one phase shifter provided on at least one of the plurality of optical waveguides.

The tunable laser source may further include at least one monitoring device provided on at least one output port of at least one of the plurality of optical waveguides.

The tunable laser source may form a closed loop resonator.

The tunable laser source may form a Fabry-Perot resonator.

The tunable laser source may further include grating mirrors or Sagnac mirrors provided at both ends of the Fabry-Perot resonator.

According to an aspect of another example embodiment, there is provided a light steering apparatus including a tunable laser source, and a steering device configured to steer a laser beam incident from the tunable laser source, wherein the tunable laser source includes a plurality of optical waveguides, at least three optical resonators provided between the plurality of optical waveguides and optically coupled to the plurality of optical waveguides, the at least three optical resonators having different lengths, and at least one optical amplifier provided on at least one of the plurality of optical waveguides, wherein a ratio of a first length of a first optical resonator of the at least three optical resonators to a second length of a second optical resonator of the at least three optical resonators is not an integer.

The at least three optical resonators may include a first ring resonator having a first circumference length, a second ring resonator having a second circumference length greater than the first circumference length, and a third ring resonator having a third circumference length greater than the second circumference length, and a first ratio of the third circumference length to the first circumference length or a second ratio of the third circumference length to the second circumference length may not be an integer.

The tunable laser source may further include at least one monitoring device provided on at least one output port of at least one the plurality of optical waveguides.

The light steering apparatus may further include a one-dimensional antenna array provided in a light output portion of the steering device.

The light steering apparatus may further include a detector configured to detect the laser beam steered by the steering device.

According to an aspect of another example embodiment, there is provided a tunable laser source including a plurality of optical waveguides, at least three optical resonators provided between the plurality of optical waveguides and optically coupled to the plurality of optical waveguides, the at least three optical resonators having different lengths, and at least one optical amplifier provided on at least one of the plurality of optical waveguides, wherein a ratio of a first length of a first optical resonator of the at least three optical resonators to a second length of a second optical resonator of the at least three optical resonators is not an integer, and wherein at least one optical resonator of the at least three optical resonator is provided on one side of the at least one optical amplifier and at least two optical resonator of the at least three optical resonators are provided on an opposite side of the at least one optical amplifier.

BRIEF DESCRIPTION OF THE DRAWINGS

The above and/or other aspects, features, and advantages of example embodiments will be more apparent from the following description taken in conjunction with the accompanying drawings, in which:

FIGS. 2A, 2B, and 2C are views illustrating optical loss differences according to the circumference length ratio of ring resonators of the tunable laser source shown in FIG. 1;

DETAILED DESCRIPTION

Figure 1:
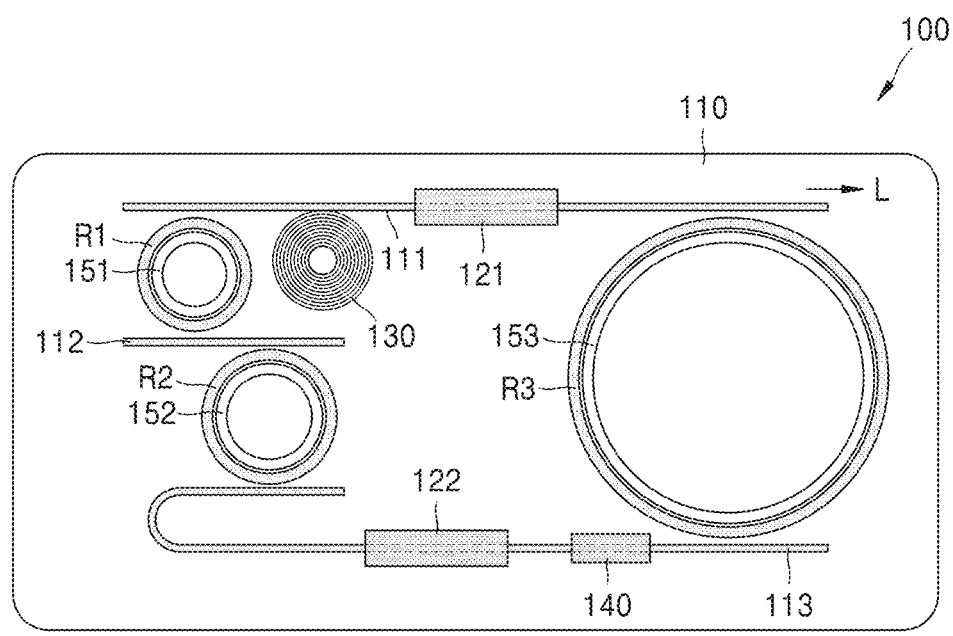
FIG. 1 is a view illustrating a tunable laser source according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described with reference to the accompanying drawings. In the drawings, the sizes of elements may be exaggerated for clarity of illustration. The example embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or exemplary terms are just used herein to describe technical ideas and should not be considered for purposes of limitation unless defined by the claims.

FIG. 1 illustrates a tunable laser source 100 according to an example embodiment. FIG. 1 shows a tunable laser source 100 of an on-chip type in which all components are integrated on a substrate 110. The tunable laser source 100 may be, for example, a tunable laser diode.

The tunable laser source 100 shown in FIG. 1 may as a whole form a closed loop resonator. Referring to FIG. 1, the tunable laser source 100 may include: a plurality of optical waveguides 111, 112, and 113, three or more optical resonators R1, R2, and R3 arranged between the optical waveguides 111, 112, and 113, and one or more optical amplifiers 121 and 122 provided on the optical waveguides 111, 112, and 113.

The optical waveguides 111, 112, and 113, the three or more optical resonators R1, R2, and R3, and the one or more optical amplifiers 121 and 122 may be integrated on the substrate 110 through semiconductor processes. Here, the substrate 110 may be a semiconductor substrate such as a silicon substrate, but the substrate 110 is not limited thereto.

The optical waveguides 111, 112, and 113 may include a first optical waveguide 111, a second optical waveguide 112, and a third optical waveguide 113, which are separate from each other. The first, second, and third optical waveguides 111, 112, and 113 may be arranged side by side, but are not limited thereto. The first, second, and third optical waveguides 111, 112, and 113 may include, for example, silicon. However, this is merely an example, and the first, second, and third optical waveguides 111, 112, and 113 may include various other materials.

The three or more optical resonators R1, R2, and R3 may include a first ring resonator R1, a second ring resonator R2, and a third ring resonator R3. For example, the first ring resonator R1 may be arranged between the first optical waveguide 111 and the second optical waveguide 112. Here, the first ring resonator R1 may be physically separated from the first and second optical waveguides 111 and 112, but may be optically coupled to the first and second optical waveguides 111 and 112. The first ring resonator R1 may be physically separated from the first and second optical waveguides 111 and 112 by about 0.1 μm to about 1 μm, but embodiments are not limited thereto.

The second ring resonator R2 may be arranged between the second optical waveguide 112 and the third optical waveguide 113. Here, the second ring resonator R2 may be physically separated from the second and third optical waveguides 112 and 113, but may be optically coupled to the second and third optical waveguides 112 and 113. The second ring resonator R2 may be physically separated from the second and third optical waveguides 112 and 113 by about 0.1 μm to about 1 μm, but embodiments are not limited thereto.

The third ring resonator R3 may be arranged between the first optical waveguide 111 and the third optical waveguide 113. Here, the third ring resonator R3 may be physically separated from the first and third optical waveguides 111 and 113, but may be optically coupled to the first and third optical waveguides 111 and 113. The third ring resonator R3 may be physically separated from the first and third optical waveguides 111 and 113 by about 0.1 μm to about 1 μm, but embodiments are not limited thereto.

Each of the first, second, and third ring resonators R1, R2, and R3 may have a circular shape or various other ring shapes. The first, second, and third ring resonators R1, R2, and R3 may have different lengths, for example, different circumference lengths. For example, the first ring resonator R1 may have a first circumference length L1, the second ring resonator R2 may have a second circumference length L2 which is greater than the first circumference length L1, the third ring resonator R3 may have a third circumference length L3 which is greater than the second circumference length L2. For example, each of the first, second, and third ring resonators R1, R2, and R3 may have a circumference length of about several tens of micrometers (μm) or about several hundreds of micrometers (μm). However, embodiments are not limited thereto, and each of the first, second, and third ring resonators R1, R2, and R3 may have various other circumference lengths.

The difference between the first circumference length L1 and the second circumference length L2 may depend on a variable wavelength range. For example, the difference between the first circumference length L1 and the second circumference length L2 may be about 1% to about 10% of the first circumference length L1. However, embodiments are not limited thereto. In addition, as described later, when the ratio L3/L1 of the third circumference length L3 to the first circumference length L1 or the ratio L3/L2 of the third circumference length L3 to the second circumference length L2 is designed to be a number other than an integer, mode selectivity may be improved.

Controllers 151, 152, and 153 may be respectively provided in the vicinity of the first, second, and third ring resonators R1, R2, and R3 to adjust the refractive indexes of the first, second, and third ring resonators R1, R2, and R3. For example, a first controller 151 configured to adjust the refractive index of the first ring resonator R1 may be provided in the vicinity of the first ring resonator R1, a second controller 52 configured to adjust the refractive index of the second ring resonator R2 may be provided in the vicinity of the second ring resonator R2, and a third controller 153 configured to adjust the refractive index of the third ring resonator R3 may be provided in the vicinity of the third ring resonator R3. In the example shown in FIG. 1, the controllers 151, 152, and 153 are provided inside the ring resonators R1, R2, and R3. However, embodiments are not limited thereto, and the positions of the controller 151, 152, 153 may be variously modified.

The first, second, and third controllers 151, 152, and 153 may respectively control the refractive indexes of the first, second, and third ring resonators R1, R2, and R3 such that the resonant wavelength comb of each of the first, second, and third ring resonators R1, R2, and R3 may be horizontally moved along a wavelength axis to realize a variable wavelength as described later.

For example, the controllers 151, 152, and 153 may respectively include heating elements configured to vary the refractive indexes of the ring resonators R1, R2, and R3 by heating the ring resonators R1, R2, and R3, electrode elements configured to vary the refractive indexes of the ring resonators R1, R2, and R3 by applying electric fields around the ring resonators R1, R2, and R3, or piezoelectric elements configured to vary the refractive indexes of the ring resonators R1, R2, and R3 by deforming the ring resonators R1, R2, and R3.

The one or more optical amplifiers 121 and 122 may include a first amplifier 121 and a second optical amplifier 122 provided on the optical waveguides 111, 112 and 113. In the example shown in FIG. 1, the first optical amplifier 121 is provided on the first optical waveguide 111, and the second optical amplifier 122 is provided on the third optical waveguide 113. However, embodiments are not limited thereto, and the number and positions of optical amplifiers may be variously determined. The first and second ring resonators R1 and R2 may be provided on one side of the first and second optical amplifiers 121 and 122, and the third ring resonator R3 may be provided on the other side of the first and second optical amplifiers 121 and 122.

The first and second optical amplifiers 121 and 122 may be configured to amplify light and configured to generate light as well. Each of the first and second optical amplifiers 121 and 122 may include, for example, a semiconductor optical amplifier. The semiconductor optical amplifier may be formed, for example, by depositing a material layer including a Group Ill-V semiconductor or a Group II-VI semiconductor on an optical waveguide including silicon. However, embodiments are not limited thereto, and, each of the first and second optical amplifiers 121 and 122 may include an ion-doped amplifier.

Light generated by at least one of the first optical amplifier 121 and the second optical amplifier 122 may be amplified while propagating through the first, second, and third ring resonators R1, R2, and R3 clockwise or counterclockwise in the closed loop resonator illustrated in FIG. 1, and may then be output with an intended resonant wavelength. FIG. 1 shows an example in which an amplified laser beam L is output to the outside through a main output port of the first optical waveguide 111.

In general, a ring resonator has a resonant wavelength comb that includes resonant wavelengths arranged at intervals determined depending on the circumference length of the ring resonator. When a plurality of ring resonators having different circumference lengths are combined with each other, a plurality of resonant wavelength combs having different intervals are generated, and among the resonant wavelength combs, only a first oscillation mode in which first resonant wavelengths are arranged may be selected to oscillate a single-mode laser beam. In addition, at least one of the resonant wavelength combs may be horizontally moved along a wavelength axis by adjusting the refractive index of at least one of the ring resonators, and thus a second oscillation mode in which second resonant wavelengths are arranged may be selected instead of the first oscillation mode, thereby realizing a tunable laser source.

High mode selectivity is required for stable single-mode oscillation in a tunable laser source. Mode selectivity may be determined by the optical gain difference or optical loss difference between an oscillation mode which is the most favorable mode for oscillation and a competition mode which is the second most favorable mode for oscillation. Assuming that optical gain is wavelength independent, mode selectivity may be determined by a difference in optical loss between the oscillation mode and the competition mode.

In the oscillation mode, all resonant wavelengths are aligned, and in the competition mode, at least some of the resonant wavelengths are misaligned. Thus, an optical loss difference occurs between the oscillation mode and the competition mode, and as the optical loss difference increases, mode selectivity may increase.

The mode selectivity of the tunable laser source 100 of the example embodiment may be improved by adjusting the first, second, and third circumference lengths L1, L2, and L3 of the first, second, and third ring resonators R1, R2, and R3.

As described above, the first, second, and third ring resonators R1, R2, and R3 may respectively have the first, second, and third circumference lengths L1, L2, and L3. Here, when the ratio L3/L1 of the third circumference length L3 of the third ring resonator R3 to the first circumference length L1 of the first ring resonator R1 or the ratio L3/L2 of the third circumference length L3 of the third ring resonator R3 to the second circumference length L2 of the second ring resonator R2 is designed to be a number other than an integer, the mode selectivity of the tunable laser source 100 may be improved as described later.

Figure 2A:
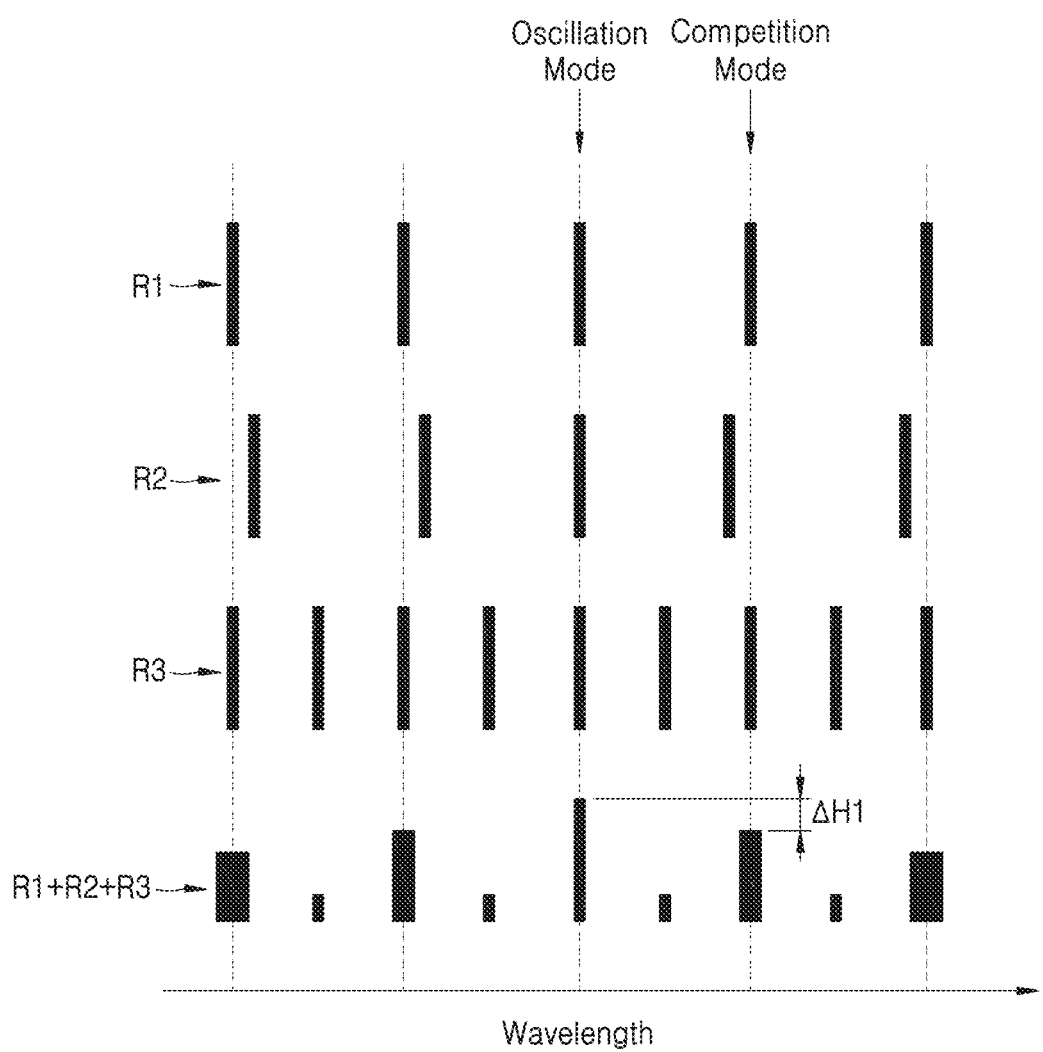
Figure 2C:
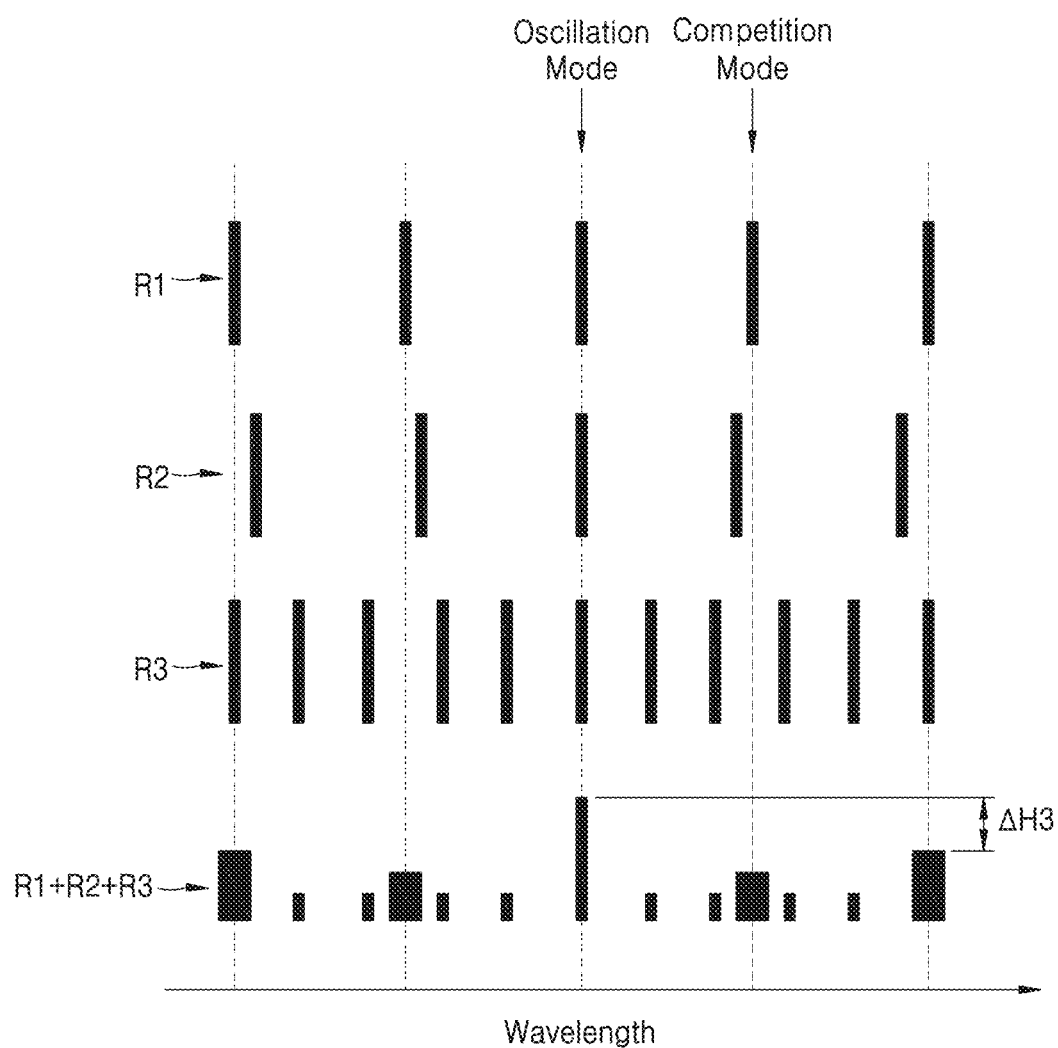

FIGS. 2A to 2C are views illustrating optical loss differences according to the circumference length ratio of the ring resonators R1, R2, and R3 of the tunable laser source 100 shown in FIG. 1. In the examples shown in FIGS. 2A to 2C, the difference between the first circumference length L1 of the first ring resonator R1 and the second circumference length L2 of the second ring resonator R2 is 1% to 10% of the first circumference length L1.

FIG. 2A shows the wavelength combs of the first, second, and third ring resonators R1, R2, and R3, and the wavelength comb of the combination of the first, second, and third ring resonators R1, R2, and R3 when the third circumference length L3 of the third ring resonator R3 is twice the first circumference length L1 of the first ring resonator R1, where the ratio L3/L1 of the third circumference length L3 to the first circumference length L1 is 2.

FIG. 2B shows the wavelength combs of the first, second, and third ring resonators R1, R2, and R3, and the wavelength comb of the combination of the first, second, and third ring resonators R1, R2, and R3 when the third circumference length L3 of the third resonator R3 is three times the first circumference length L1 of the first resonator R1, where the ratio L3/L1 of the third circumference length L3 to the first circumference length L1 is 3.

FIG. 2C shows the wavelength combs of the first, second, and third ring resonators R1, R2, and R3, and the wavelength comb of the combination of the first, second, and third ring resonators R1, R2, and R3 when the third circumference length L3 of the third resonator R3 is 2.5 times the first circumference length L1 of the first resonator R1, where the ratio L3/L1 of the third circumference length L3 to the first circumference length L1 is 2.5.

Referring to FIGS. 2A to 2C, the optical loss difference $\Delta H3$ between the oscillation mode and the competition mode when the ratio L3/L1 of the third circumference length L3 to the first circumference length L1 is 2.5 is greater than the optical loss difference $\Delta H1$ when the ratio L3/L1 of the third circumference length L3 to the first circumference length L1 is 2, and the optical loss difference $\Delta H2$ when the ratio L3/L1 of the third circumference length L3 to the first circumference length L1 is 3.

In a simulation experiment, optical loss differences were measured while varying the ratio L3/L1 of the third circumference length L3 of the third ring resonator R3 to the first circumference length L1 of the first ring resonator R1. In the simulation experiment, the difference between the first circumference length L1 of the first ring resonator R1 and the second circumference length L2 of the second ring resonator R2 was set to be 1% to 10% of the first circumference length L1.

When only the first ring resonator R1 and the second ring resonator R2 were combined with each other, the optical loss difference between the oscillation mode and the competition mode was measured as low as about 11 dB to about 14 dB. This shows that when only two ring resonators are used, mode selectivity may be relatively low.

When the ratio L3/L1 of the third circumference length L3 to the first circumference length L1 was set to be 2 and 3, the optical loss difference between the oscillation mode and the competition mode was measured to be about 12 dB to about 16 dB. This shows that when the ratio L3/L1 of the third circumference length L3 to the first circumference length L1 is set to be an integer in the tunable laser source 100 including the three ring resonators R1, R2, and R3, the mode selectivity of the tunable laser source 100 may be as low as in the case of using only two ring resonators.

When the ratio L3/L1 of the third circumference length L3 to the first circumference length L1 was set to be 2.5, the optical loss difference between the oscillation mode and the competition mode was measured to be about 16 dB to about 20 dB. This shows that when the ratio L3/L1 of the third circumference length L3 to the first circumference length L1 is set to be a non-integer number in the tunable laser source 100 including the three ring resonators R1, R2, and R3, the mode selectivity of the tunable laser source 100 may be improved compared to the case in which the ratio L3/L1 is an integer.

When the ratio L3/L1 of the third circumference length L3 to the first circumference length L1 was set to be 2.25 and 2.75, the optical loss difference between the oscillation mode and the competition mode was measured to be about 24 dB to about 28 dB. When the ratio L3/L1 of the third circumference length L3 to the first circumference length L1 was set to be 2.225 and 2.275, the optical loss difference between the oscillation mode and the competition mode was measured to be about 32 dB to about 37 dB.

These results show that when the ratio L3/L1 of the third circumference length L3 to the first circumference length L1 of the tunable laser source 100 including the three ring resonators R1, R2, and R3 is set to be a rational number having two or more digits after the decimal point, the mode selectivity of the tunable laser source 100 is further improved. In addition, these results show that the mode selectivity improves as the number of digits after the decimal point increases. Thus, when the ratio L3/L1 of the third circumference length L3 to the first circumference length L1 of the tunable laser source 100 including the three ring resonators R1, R2, and R3 is set to be an irrational number, the tunable laser source 100 may have improved mode selectivity.

Although the above description is given with respect to only the ratio L3/L1 of the third circumference length L3 of the third ring resonator R3 to the first circumference length L1 of the first resonator R1, the same may apply to the ratio L3/L2 of the third circumference length L3 of the third ring resonator R3 to the second circumference length L2 of the second ring resonator R2. For example, when the ratio L3/L2 of the third circumference length L3 of the third ring resonator R3 to the second circumference length L2 of the second ring resonator R2 is designed to be a non-integer number, the mode selectivity may be improved.

A tunable laser source, which is used in a light steering apparatus such as a light detection and ranging (LiDAR) apparatus, may have a great coherence length when the spectral linewidth in the oscillation mode of the tunable laser source is small, and in this case, the tunable laser source may be capable of long-range detection. Because the spectral linewidth in the oscillation mode of a resonator is approximately inversely proportional to the square of the total length of the resonator, the spectral linewidth decreases as the total length of the resonator increases.

The tunable laser source 100 of the example embodiment may include one or more optical delay lines 130 provided on the optical waveguides 111, 112, and 113 to reduce the spectral linewidth in the oscillation mode. FIG. 1 shows an example in which one optical delay line 130 is provided on the first optical waveguide 111. However, embodiments are not limited thereto, and the number and positions of optical delay lines 130 may be variously determined. The optical delay line 130 may have a function of reducing the spectral linewidth in the oscillation mode by increasing the total length of the entire resonator, which is a closed loop resonator. The optical delay line 130 may include, for example, a spiral waveguide.

The tunable laser source 100 may further include one or more phase shifters 140 provided on the optical waveguides 111, 112, and 113. In this case, when the phase of the entire resonator, which is a closed loop resonator, is different from the phases of the ring resonators R1, R2, and R3, the phase shifters 140 may compensate for the phase difference. Although FIG. 1 shows an example in which one phase shifter 140 is provided on the third optical waveguide 113, the number and positions of phase shifters 140 may be variously determined.

As described above, the tunable laser source 100 of the example embodiment includes three ring resonators having different circumference lengths, for example, the first, second, and third ring resonators R1, R2, and R3, and the ratio L3/L1 of the third circumference length L3 of the third ring resonator R3 to the first circumference length L1 of the first ring resonator R1 or the ratio L3/L2 of the third circumference length L3 of the third ring resonator R3 to the second circumference length L2 of the second ring resonator R2 may be adjusted to be a non-integer number to improve the mode selectivity of the tunable laser source 100, and thus to realize a stable single oscillation mode.

In addition, the length total of the entire resonator may be increased by providing one or more optical delay lines 130 on the optical waveguides 111, 112, and 113, and thus the spectral linewidth in the oscillation mode may be reduced. In addition, all the components of the tunable laser source 100 may be integrated on a single substrate, for example, the substrate 110, and thus the tunable laser source 100 may be implemented as an on-chip device.

Figure 3:
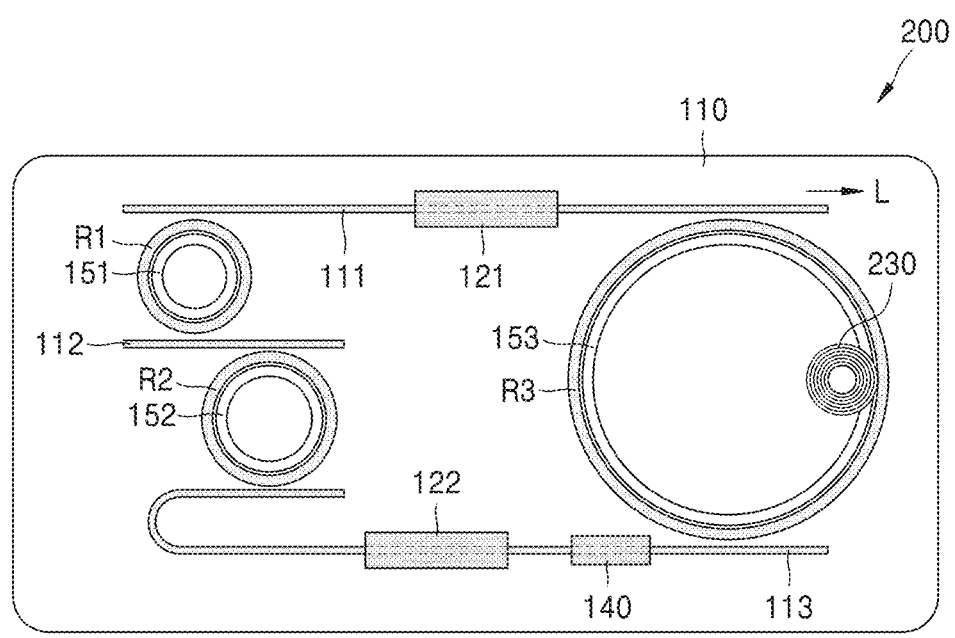
FIG. 3 illustrates a tunable laser source according to another example embodiment.

FIG. 3 illustrates a tunable laser source 200 according to another example embodiment. The tunable laser source 200 shown in FIG. 3 is the same as the tunable laser source 100 shown in FIG. 1 except for the position of an optical delay line 230.

Referring to FIG. 3, the tunable laser source 200 may include one or more optical delay lines 230 provided in a plurality of ring resonators R1, R2, and R3 including first, second, and third ring resonators R1, R2, and R3. Here, the optical delay lines 230 may include, for example, spiral waveguides. FIG. 3 shows an example in which one optical delay line 230 is provided in the third ring resonator R3. However, embodiments are not limited thereto, and the optical delay line 230 may be provided in the first ring resonator R1 or the second ring resonator R2. In addition, the number and positions of optical delay lines 230 may be variously determined.

Even when the optical delay line 230 provided in the ring resonators R1, R2, and R3 of the tunable laser source 200 is shorter than the optical delay line 130 provided on the optical waveguides 111, 112, and 113 of the tunable laser source 100 shown in FIG. 1, the spectral linewidth in the oscillation mode of the tunable laser source 200 may be reduced as much as the spectral linewidth in the oscillation mode of the tunable laser source 100 is reduced. Therefore, the tunable laser source 200 may have a smaller size than the tunable laser source 100 shown in FIG. 1.

Figure 4:
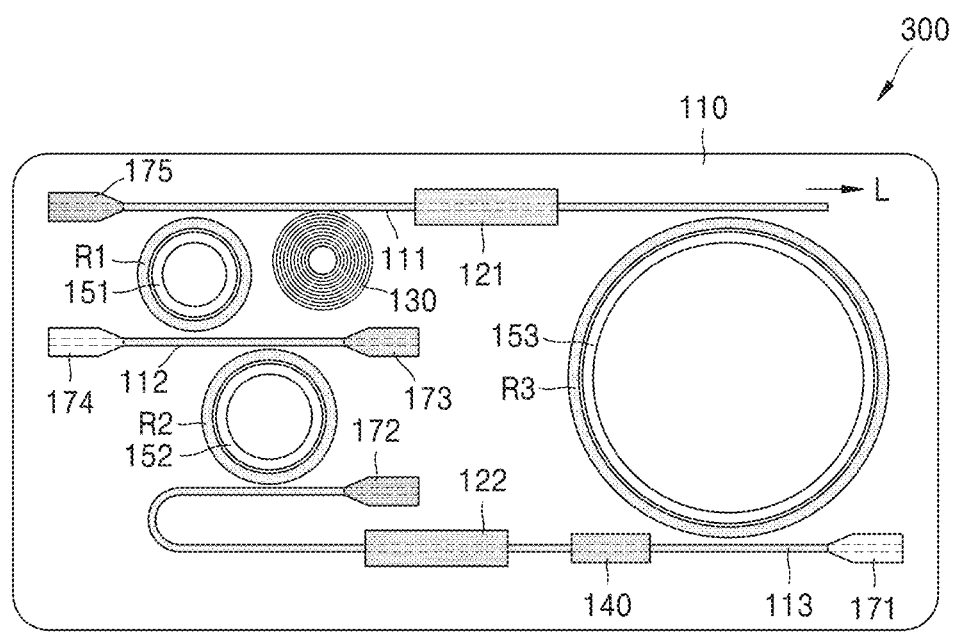
FIG. 4 illustrates a tunable laser source according to another example embodiment.

FIG. 4 illustrates a tunable laser source 300 according to another example embodiment. The tunable laser source 300 shown in FIG. 4 is the same as the tunable laser source 100 shown in FIG. 1 except for monitoring devices 171 to 175.

Referring to FIG. 4, the tunable laser source 300 may include one or more monitoring devices including a first monitoring device 171, a second monitoring device 172, a third monitoring device 173, a fourth monitoring device 174, and a fifth monitoring device 175. In this case, the one or more monitoring devices 171 to 175 may be provided on auxiliary output ports of a plurality of optical waveguides 111, 112, and 113 other than a main output port of optical waveguides 111, 112, and 113 through which an amplified laser beam L is output. The one or more monitoring devices 171 to 175 may measure the amounts of light output from the auxiliary output ports of the optical waveguides 111, 112, and 113 to monitor a wavelength alignment between the first, second, and third ring resonators R1, R2, and R3. Although FIG. 4 shows an example in which five monitoring devices 171 to 175, are provided, embodiments are not limited thereto, and the number of monitoring devices 171 to 175 may be variously determined.

In FIG. 4, one end of a first optical waveguide 111, both ends of a second optical waveguide 112, and both ends of a third optical waveguide 113 may correspond to the auxiliary output ports. In addition, the other end of the first optical waveguide 111 may correspond to the main output port through which an amplified laser beam L is output.

The first and second monitoring devices 171 and 172 may be provided on both ends of the third optical waveguide 113, and the third and fourth monitoring devices 173 and 174 may be provided on both ends of the second optical waveguide 112. In addition, the fifth monitoring device 175 may be provided on one end of the first optical waveguide 111. Each of the first to fifth monitoring devices 171 to 175 may include, for example, a photodiode.

The first and second monitoring devices 171 and 172 may monitor wavelength alignment between the second ring resonator R2 and the third ring resonator R3, and the third and fourth monitoring devices 173 and 174 may monitor wavelength alignment between the first ring resonator R1 and the second ring resonator R2. In addition, the fifth monitoring device 175 may monitor wavelength alignment between the first ring resonator R1 and the third ring resonator R3.

As described above, because the monitoring devices 171 to 175 are provided on the auxiliary output ports of the optical waveguides 111, 112 and 113 to monitor the wavelength alignment between the ring resonators R1, R2 and R3, on-chip control may be possible.

The tunable laser source 300 may include one or more optical delay lines 130 provided on the optical waveguides 111, 112, and 113.

Figure 5:
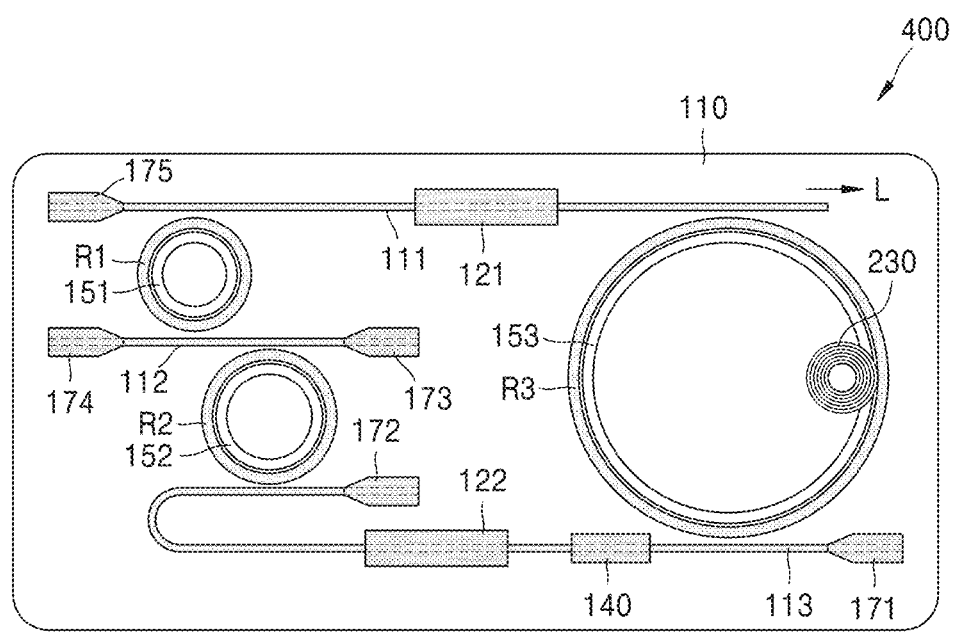
FIG. 5 illustrates a tunable laser source according to another example embodiment.

FIG. 5 illustrates a tunable laser source 400 according to another example embodiment. The tunable laser source 400 shown in FIG. 5 is the same as the tunable laser source 300 shown in FIG. 4 except for the position of an optical delay line 230. Referring to FIG. 5, the tunable laser source 400 may include one or more optical delay lines 230 provided in a plurality of ring resonators R1, R2, and R3.

Figure 6:
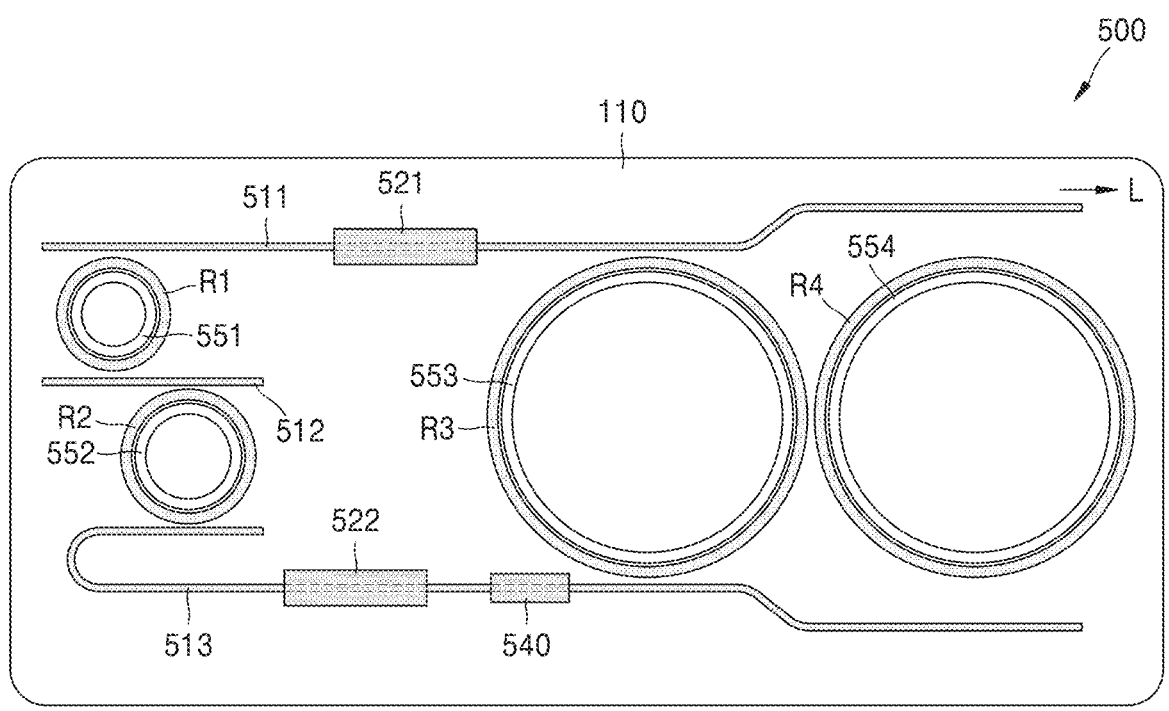
FIG. 6 illustrates a tunable laser source according to another example embodiment.

FIG. 6 illustrates a tunable laser source 500 according to another example embodiment. The tunable laser source 500 shown in FIG. 6 may as a whole form a closed loop resonator.

Referring to FIG. 6, first optical waveguide 511, a second optical waveguide 512, and a third optical waveguide 513 are arranged apart from each other, and four ring resonators, for example, a first ring resonator R1, a second ring resonator R2, a third ring resonator R3, and a fourth ring resonator R4 are arranged between the first, second, and third optical waveguides 511, 512, and 513.

The first ring resonator R1 may be arranged between the first optical waveguide 511 and the second optical waveguide 512, and the second ring resonator R2 may be arranged between the second optical waveguide 512 and the third optical waveguide 513. Here, the first and second ring resonators R1 and R2 may be physically separated from the first, second and third optical waveguides 511, 512 and 513 but may be optically coupled to the first, second, and third optical waveguides 511, 512 and 513.

The third ring resonator R3 may be arranged between the first optical waveguide 511 and the third optical waveguide 513. Here, the third ring resonator R3 may be physically separated from the first and third optical waveguides 511 and 513, but may be optically coupled to the first and third optical waveguides 511 and 513.

The fourth ring resonator R4 may be arranged adjacent to the third ring resonator R3 between the first optical waveguide 511 and the third optical waveguide 513. Here, the fourth ring resonator R4 may be physically separate from the third ring resonator R3, but may be optically coupled to the third ring resonator R3. In addition, the fourth ring resonator R4 may be physically and optically separate from the first and third optical waveguides 511 and 513.

In the example embodiment, like the optical delay lines 130 and 230 described above, the fourth ring resonator R4 may have a function of reducing a spectral linewidth by increasing the total length of the entire resonator, which is a closed loop resonator. The fourth ring resonator R4 may have the same size and resonant wavelength as the third ring resonator R3. Therefore, light resonating in the third ring resonator R3 may come to resonate in the fourth ring resonator R4, thereby increasing the total length of the entire resonator and reducing the spectral linewidth of a laser beam output from the tunable laser source 500.

The first, second, and third ring resonators R1, R2, and R3 may have different circumference lengths from each other. For example, the first ring resonator R1 may have a first circumference length L1, the second ring resonator R2 may have a second circumference length L2 which is greater than the first circumference length L1, the third ring resonator R3 may have a third circumference length L3 which is greater than the second circumference length L2.

The difference between the first circumference length L1 and the second circumference length L2 may be about 1% to about 10% of the first circumference length L1, but embodiments are not limited thereto. In addition, when the ratio L3/L1 of the third circumference length L3 to the first circumference length L3 or the ratio L3/L2 of the third circumference length L3 to the third circumference length L2 is designed to be a number other than an integer, mode selectivity may be improved.

A first controller 551, a second controller 552, a third controller 553, and a fourth controller 554 may be provided in the vicinity of the first, second, third, and fourth ring resonators R1, R2, R3, and R4 to adjust the refractive indexes of the first, second, third, and fourth ring resonators R1, R2, R3, and R4. Here, each of the controller 551, 552, 553, and 554 may include, for example, a heating element, an electrode element, or a piezoelectric element.

One or more optical amplifiers 521 and 522 may be provided on the first, second, and third optical waveguides 511, 512 and 513. In the example shown in FIG. 6, a first optical amplifier 521 is provided on the first optical waveguide 511, and a second optical amplifier 522 is provided on the third optical waveguide 513. Here, the first and second ring resonators R1 and R2 may be provided on a side of the first and second optical amplifiers 521 and 522, and the third and fourth ring resonators R3 and R4 may be provided on the other side of the first and second optical amplifiers 521 and 522.

At least one phase shifter 540 may be further provided on at least one of the first, second, and third optical waveguides 511, 512, and 513. FIG. 6 shows an example in which one phase shifter 540 is provided on the third optical waveguide 513, but embodiments are not limited thereto, and the number and positions of phase shifters 540 may be variously determined.

Figure 7:
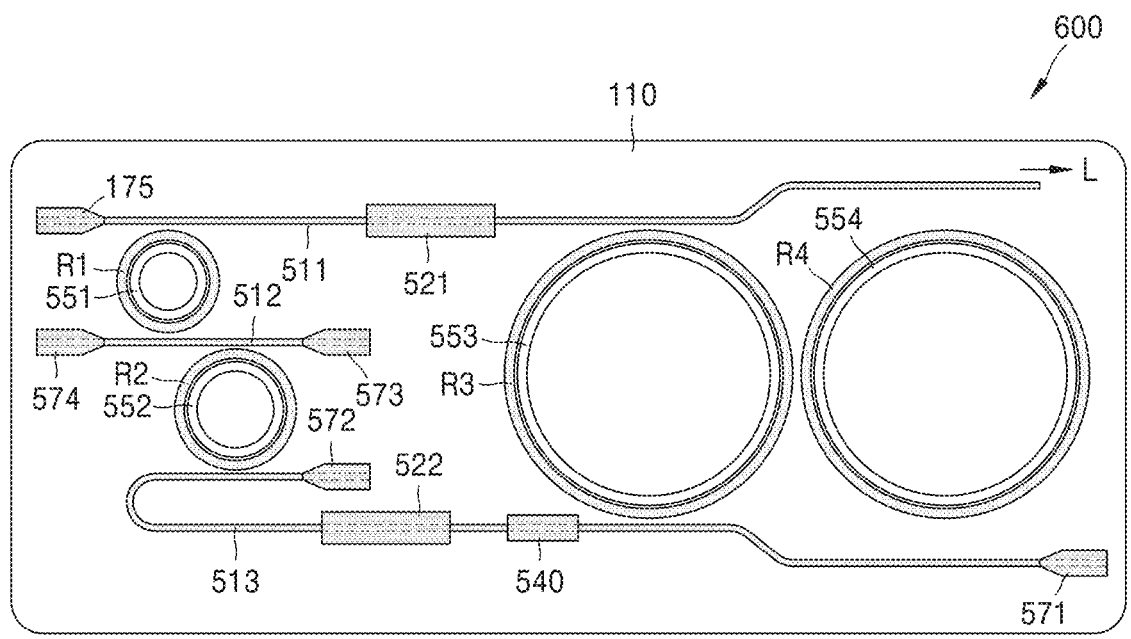
FIG. 7 illustrates a tunable laser source according to another example embodiment.

FIG. 7 illustrates a tunable laser source 600 according to another example embodiment. The tunable laser source 600 shown in FIG. 7 is the same as the tunable laser source 500 shown in FIG. 6 except for monitoring devices 571 to 575.

Referring to FIG. 7, one or more monitoring devices, for example, a first monitoring device 571, a second monitoring device 572, a third monitoring device 573, a fourth monitoring device 574, and a fifth monitoring device 575 may be provided on first, second, and third optical waveguides 511, 512 and 513. For example, the one or more monitoring devices 571 to 575, may be provided on auxiliary output ports of the first, second, and third optical waveguides 511, 512, and 513.

The first and second monitoring devices 571 and 572 may be provided on both ends of the third optical waveguide 513 to monitor wavelength alignment between a second ring resonator R2 and a third ring resonator R3. The third and fourth monitoring devices 573 and 574 may be provided on both ends of the second optical waveguide 512 to monitor wavelength alignment between a first ring resonator R1 and the second ring resonator R2. In addition, the fifth monitoring device 575 may be provided on an end of the first optical waveguide 511 to monitor wavelength alignment between the first ring resonator R1 and the third ring resonator R3.

Figure 8:
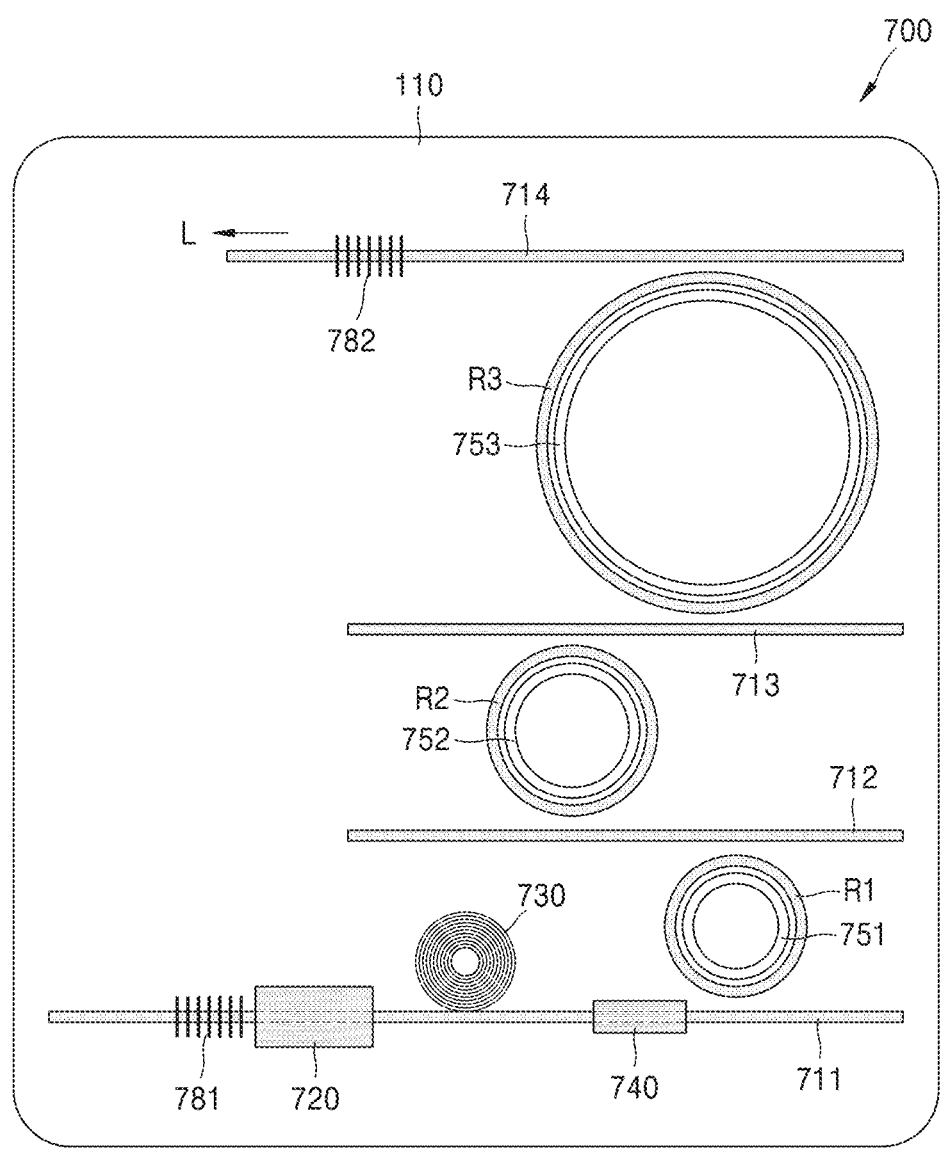
FIG. 8 illustrates a tunable laser source according to another example embodiment.

FIG. 8 illustrates a tunable laser source 700 according to another example embodiment. The tunable laser source 700 shown in FIG. 8 may as a whole form a Fabry-Perot resonator.

Referring to FIG. 8, a first optical waveguide 711, a second optical waveguide 712, a third optical waveguide 713, and a fourth optical waveguide 714 are arranged spaced apart from each other, and the first, second, and third ring resonators R1, R2, and R3, are arranged between the first, second, third, and fourth optical waveguides 711, 712, 713, and 714.

The first ring resonator R1 may be arranged between the first optical waveguide 711 and the second optical waveguide 712, the second ring resonator R2 may be arranged between the second optical waveguide 712 and the third optical waveguide 713, and the third ring resonator R3 may be arranged between the third optical waveguide 713 and the fourth optical waveguide 714. Here, the first, second, and third ring resonators R1, R2, and R3 may be physically separated from the first, second, third, and fourth optical waveguides 711, 712, 713, and 714, but may be optically coupled to the first, second, third, and fourth optical waveguides 711, 712, 713, and 714. For example, the first, second, and third ring resonators R1, R2, and R3 may be physically separated from the first, second, third, and fourth optical waveguides 711, 712, 713, and 714 by about 0.1 μm to about 1 μm, but embodiments are not limited thereto.

The first, second, and third ring resonators R1, R2, and R3 may have different circumference lengths from each other. For example, the first ring resonator R1 may have a first circumference length L1, the second ring resonator R2 may have a second circumference length L2 which is greater than the first circumference length L1, the third ring resonator R3 may have a third circumference length L3 which is greater than the second circumference length L2.

The difference between the first circumference length L1 and the second circumference length L2 may be about 1% to about 10% of the first circumference length L1, but embodiments are not limited thereto. In addition, when the ratio L3/L1 of the third circumference length L3 to the first circumference length L3 or the ratio L3/L2 of the third circumference length L3 to the third circumference length L2 is designed to be a number other than an integer, mode selectivity may be improved. A first control portion 751, a second control portion 752, and a third control portion 753 may be provided in the vicinity of the first, second, and third ring resonators R1, R2, and R3 to adjust the refractive indexes of the first, second, and third ring resonators R1, R2, and R3.

One or more optical amplifiers 720 may be provided on the first, second, third, and fourth optical waveguides 711, 712, 713, and 714. FIG. 8 shows an example in which one optical amplifier 720 is provided on the first optical waveguide 711. Here, the first, second and third ring resonators R1, R2, and R3 may be provided on one side of the optical amplifier 720.

At least one optical delay line 730 may be provided on the first, second, third, and fourth optical waveguides 711, 712, 713, and 714. FIG. 8 shows an example in which one optical delay line 730 is provided on the first optical waveguide 711. The optical delay line 730 may have a function of reducing the spectral linewidth in an oscillation mode by increasing the total length of the entire resonator, which is a Fabry-Perot resonator. The optical delay line 730 may include, for example, a spiral waveguide. At least one phase shifter 740 may be further provided on the first, second, third, and fourth optical waveguides 711, 712, 713, and 714. FIG. 8 shows an example in which one phase shifter 740 is provided on the first optical waveguide 711.

A first grating mirror 781 and a second grating mirror 782 may be provided at both ends of the entire resonator, which is a Fabry-Perot resonator. For example, the first grating mirror 781 may be provided at an end of the first optical waveguide 711, and the second grating mirror 782 may be provided at an end of the fourth optical waveguide 714. Each of the first and second grating mirrors 781 and 782 may be a highly reflective mirror on which grating patterns are periodically arranged at predetermined intervals. Here, the period of the grating patterns may be related to the wavelength of light traveling in the first, second, third, and fourth optical waveguides 711, 712, 713, and 714, and may be, for example, about 100 nm to about 500 nm. However, embodiments are not limited thereto.

Light generated by the optical amplifier 720 may be amplified while reciprocating between the first and second grating mirrors 781 and 782 through the first, second, and third ring resonators R1, R2, and R3, and may then be output with an intended resonant wavelength. FIG. 8 shows an example in which an amplified laser beam L is output to the outside through a main output port of the fourth optical waveguide 714.

The tunable laser source 700 of the example embodiment includes three ring resonators having different circumference lengths, for example, the first, second, and third ring resonators R1, R2, and R3, and the ratio L3/L1 of the third circumference length L3 of the third ring resonator R3 to the first circumference length L1 of the first ring resonator R1 or the ratio L3/L2 of the third circumference length L3 of the third ring resonator R3 to the second circumference length L2 of the second ring resonator R2 may be adjusted to be a non-integer number to improve mode selectivity, and thus to realize a stable single oscillation mode.

In addition, the total length of the entire resonator may be increased based on the one or more optical delay lines 730 provided on the first, second, third, and fourth optical waveguides 711, 712, 713, and 714, and thus the spectral linewidth in the oscillation mode may be reduced. In addition, all the components of the tunable laser source 700 may be integrated on a single substrate, for example, a substrate 110, and thus the tunable laser source 700 may be implemented as an on-chip device.

The above description is given of the case in which the first and second grating mirrors 781 and 782 are respectively provided at both ends of the Fabry-Perot resonator. However, embodiments are not limited thereto. For example, Sagnac mirrors may be provided at both ends of the Fabry-Perot resonator.

Figure 9:
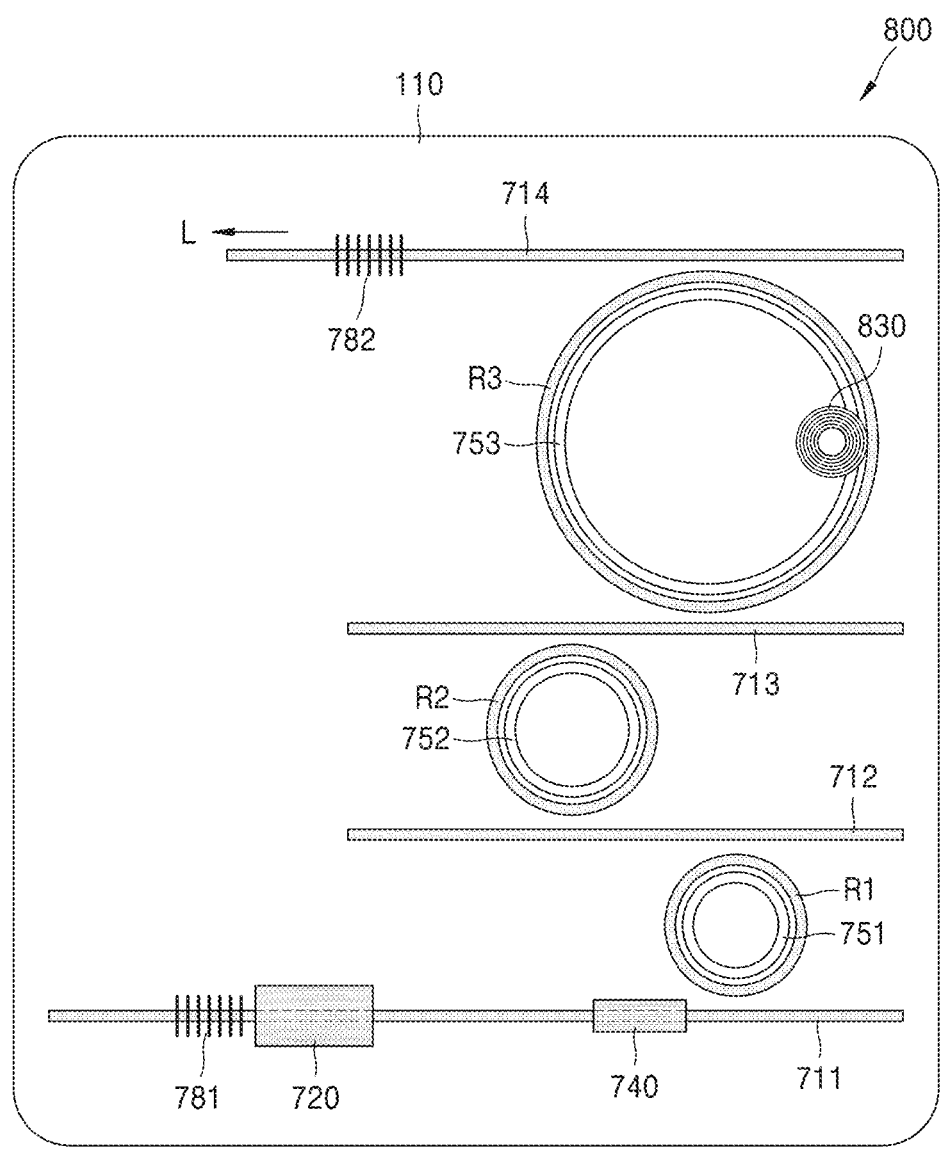
FIG. 9 illustrates a tunable laser source according to another example embodiment.

FIG. 9 illustrates a tunable laser source 800 according to another example embodiment. The tunable laser source 800 shown in FIG. 9 is the same as the tunable laser source 700 shown in FIG. 8 except for the position of an optical delay line 830.

Referring to FIG. 9, at least one optical delay line 830 may be provided in a plurality of ring resonators, R1, R2, and R3 including first, second, and third ring resonators R1, R2, and R3. FIG. 9 shows an example in which one optical delay line 830 is provided in the third ring resonator R3. Therefore, the tunable laser source 800 may be smaller than the tunable laser source 700 shown in FIG. 8.

Figure 10:
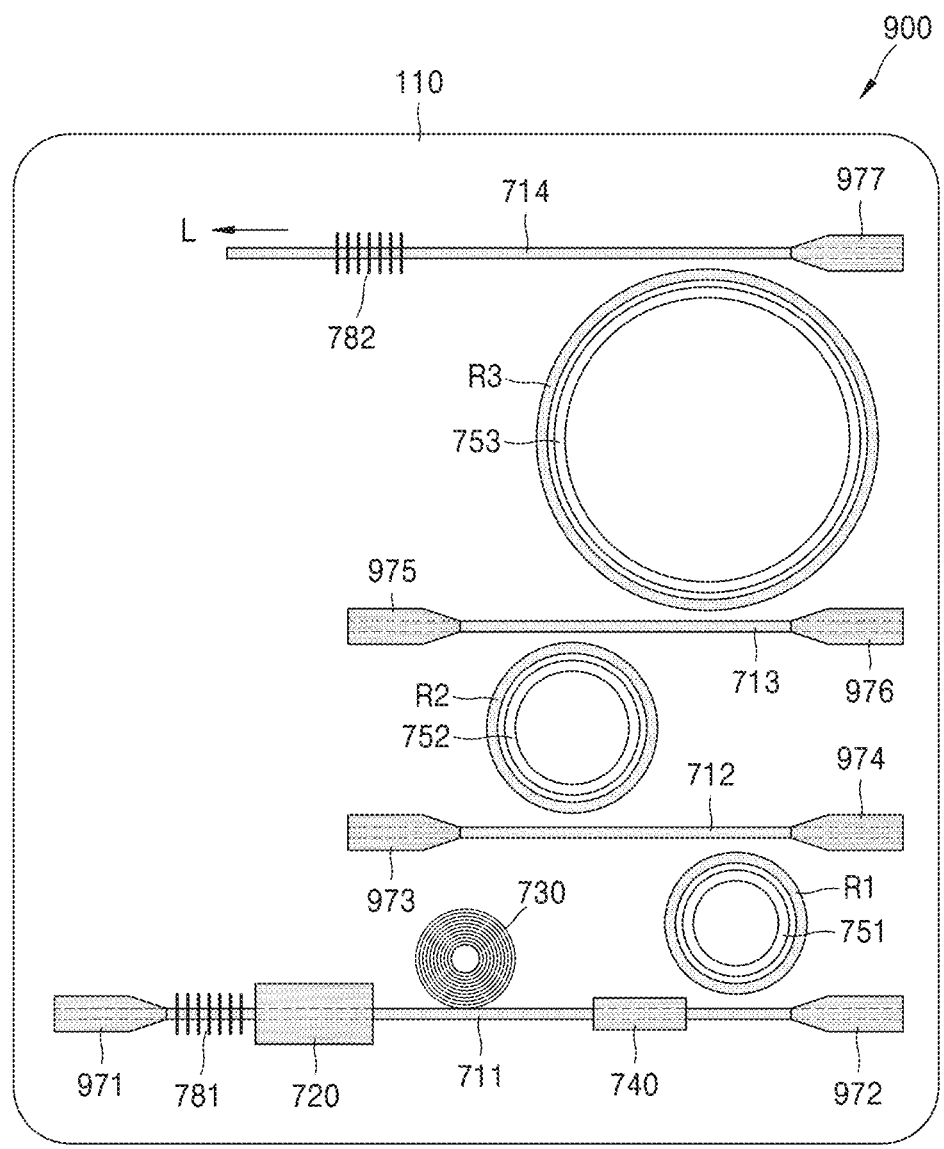
FIG. 10 illustrates a tunable laser source according to another example embodiment.

FIG. 10 illustrates a tunable laser source 900 according to another example embodiment. The tunable laser source 900 shown in FIG. 10 is the same as the tunable laser source 700 shown in FIG. 8 except for monitoring devices 971 to 977.

Referring to FIG. 10, the tunable laser source 900 may include one or more monitoring devices, for example, a first monitoring device 971, a second monitoring device 972, a third monitoring device 973, and a fourth monitoring device 974, a fifth monitoring device 975, a sixth monitoring device 976, and a seventh monitoring device 977. In this case, the one or more monitoring elements 971 to 977 may be provided on auxiliary output ports of a plurality of optical waveguides 711, 712, 713, and 714, other than a main output port of the optical waveguides 711, 712, 713, and 714 through which an amplified laser beam L is output. FIG. 10 shows an example in which the first to seventh monitoring devices 971 to 977, are provided on auxiliary output ports of the first, second, third, and fourth optical waveguides 711, 712, 713, and 714.

In FIG. 10, one end of the fourth optical waveguide 714 may correspond to a main output port through which an amplified laser beam L is output. In addition, both ends of the first optical waveguide 711, both ends of the second optical waveguide 712, both ends of the third optical waveguide 713, and the other end of the fourth optical waveguide 714 may correspond to auxiliary output ports.

The first and second monitoring devices 971 and 972 may be provided on both ends of the first optical waveguide 711, and the third and fourth monitoring devices 973 and 974 may be provided on both ends of the second optical waveguide 712. In addition, the fifth and sixth monitoring devices 975 and 976 may be provided on both ends of the third optical waveguide 713, and the seventh monitoring device 997 may be provided on the other end of the fourth optical waveguide 714. Each of the first to seventh monitoring devices 971 to 977 may include, for example, a photodiode.

The third and fourth monitoring devices 973 and 974 may monitor wavelength alignment between the second ring resonator R2 and the third ring resonator R3, and the fifth and sixth monitoring devices 975 and 976 may monitor wavelength alignment between the second ring resonator R2 and the third ring resonator R3. In addition, the first, second, and seventh monitoring device 971, 972, and 977 may monitor wavelength alignment between the first ring resonator R1 and the third ring resonator R3.

The tunable laser source 900 may include one or more optical delay lines 730 provided on the optical waveguides 711, 712, 713, and 714.

Figure 11:
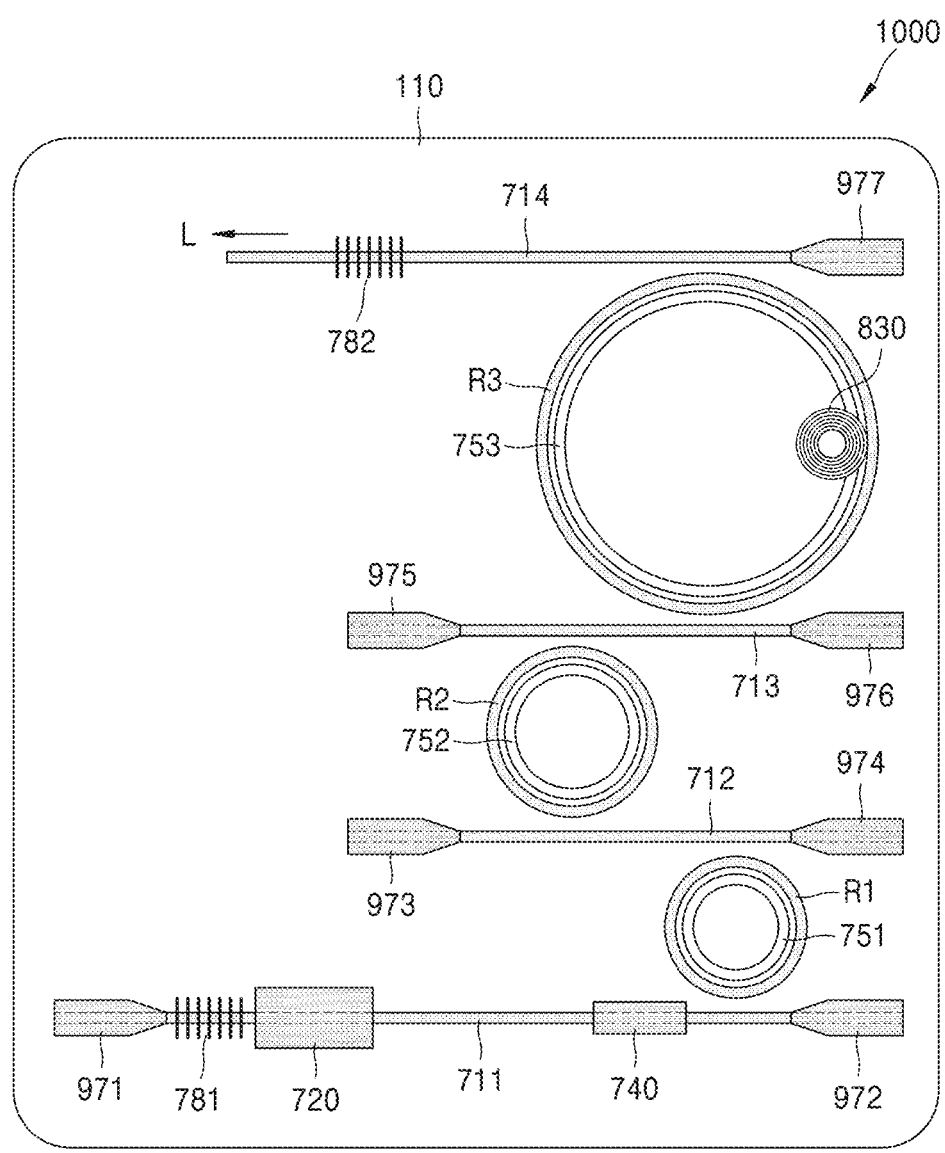
FIG. 11 illustrates a tunable laser source according to another example embodiment.

FIG. 11 illustrates a tunable laser source 1000 according to another example embodiment. The tunable laser source 1000 shown in FIG. 11 is the same as the tunable laser source 900 shown in FIG. 10 except for the position of an optical delay line 830. Referring to FIG. 11, the tunable laser source 1000 may include one or more optical delay lines 830 provided on a plurality of ring resonators, R1, R2, and R3.

Figure 12:
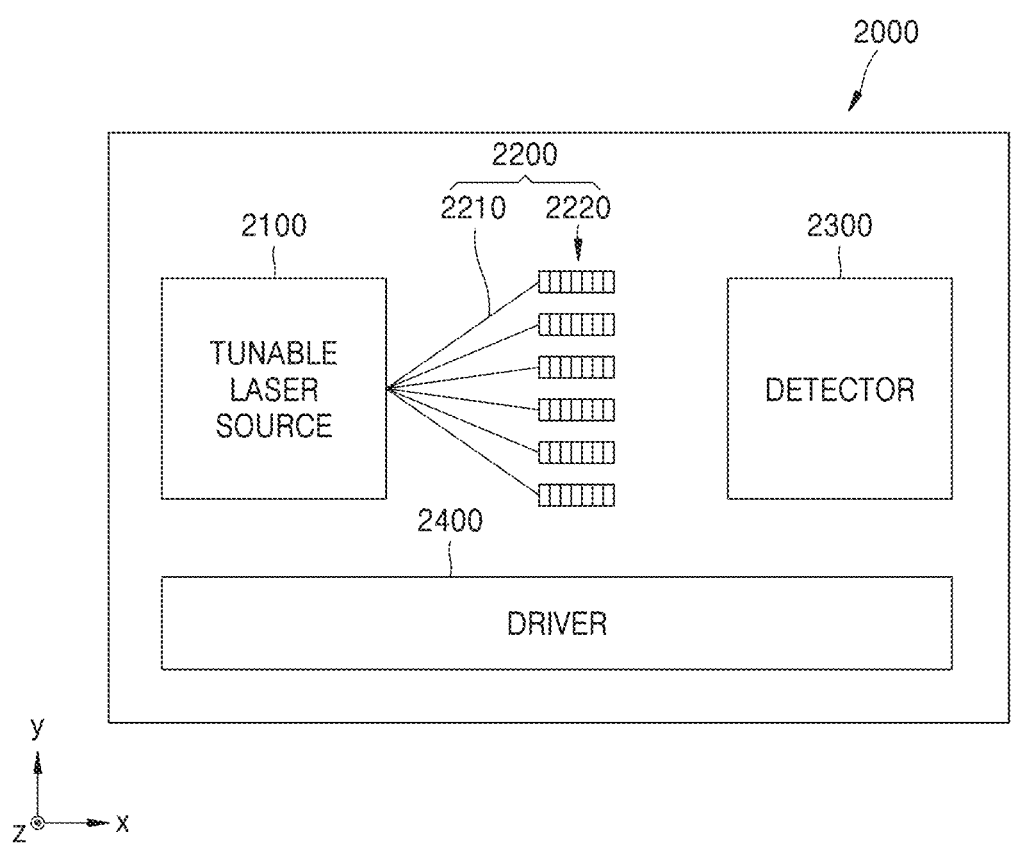
FIG. 12 illustrates a light steering apparatus according to an example embodiment.

Each of the tunable laser sources described in the above example embodiments may be used as a light source of a light steering apparatus such as a LiDAR. FIG. 12 illustrates a light steering apparatus 2000 according to an example embodiment.

Referring to FIG. 12, the light steering apparatus 2000 of the example embodiment may include a tunable laser source 2100, a steering device 2200 configured to steer light in an intended direction, a detector 2300 configured to detect steered light, and a driver 2400. The driver 2400 may include a driving circuit configured to drive the tunable laser source 2100, the steering device 2200, and the detector 2300.

The tunable laser source 2100 may be one of the tunable laser sources 100 to 1000 of the example embodiments described above.

The steering device 2200 may steer a laser beam incident from the tunable laser source 2100 in an intended direction. In addition, when light is steered by the steering device 2200 to an object and is reflected from the object, the detector 2300 may detect the reflected light.

The steering device 2200 may include a plurality of optical waveguides 2210 configured to split a laser beam incident from the tunable laser source 2100 into a plurality of laser beams and transmit the laser beams and a plurality of modulation units provided on the optical waveguides 2210 to modulate the phases of the laser beams. An antenna array 2220, in which antennas are arranged in a one-dimensional form, is provided in a light output portion of the steering device 2200.

Two-dimensional optical scanning is possible using the tunable laser source 2100 and the steering device 2200. For example, optical scanning may be performed in a first direction (y-axis direction in FIG. 12) by controlling the phase of a laser beam using the steering device 2200, and optical scanning may be performed in a second direction (x-axis direction in FIG. 12) perpendicular to the first direction by controlling the wavelength of a laser beam using the tunable laser source 2100. As described above, when the tunable laser source 2100 is used as a light source of the light steering apparatus 2000, two-dimensional optical scanning is possible even in the case in which the antenna array 2220 of the steering device 2200 is provided in a one-dimensional form.

When a single wavelength light source is used as a LiDAR light source, antennas of a steering portion are arranged in a two-dimensional form for two-dimensional optical scanning. In this case, however, it is difficult to manufacture products because a large number of antennas, for example, 10,000 or more antennas are required in each product. In addition, optical loss, a decrease in control time, or the like may occur. However, when a tunable laser source according to example embodiments is used as a LiDAR light source, two-dimensional optical scanning is possible even in the case in which antennas of a steering device are arranged in a one-dimensional form, thereby reducing the number of antennas required for two-dimensional optical scanning and facilitating commercialization. In addition, optical loss, an increase in control time, or the like may be reduced compared to the case of using a single wavelength light source.

The tunable laser sources 100 to 1000 described in the above example embodiments may be variously used as light sources of integrated optical circuits in which optical elements are integrated. For example, in addition to being used in the light steering apparatus 2000 described above, the tunable laser sources 100 to 1000 may be used in various fields including depth sensors and three-dimensional sensors. In addition, the tunable laser sources 100 to 1000 may be used as light sources for optical connection in data centers, such as light sources for wavelength division multiplexing (WDM) optical communication.

As described above, according to the one or more of the above example embodiments, the tunable laser source includes three ring resonators, for example, first, second, and third ring resonators having different lengths, and the ratio of the length of the third ring resonator to the length of the first resonator or the ratio of the length of the third ring resonator to the length of the second resonator is designed to be a number other than an integer, thereby improving mode selectivity and realizing a stable single oscillation mode.

According to example embodiments, the tunable laser source includes one or more optical delay lines provided on the optical waveguides, thereby increasing the total length of the entire resonator and reducing the spectral linewidth in an oscillation mode. In addition, all the components of the tunable laser source may be integrated on a single substrate through semiconductor processes, and thus the tunable laser source may be implemented as an on-chip tunable laser source.

According to example embodiments, the tunable laser source includes one or more monitoring devices provided on the output ports of the optical waveguides to monitor a wavelength alignment between the ring resonators, thereby enabling on-chip control.

According to example embodiments, when the tunable laser source is used as a LiDAR light source, two-dimensional optical scanning is possible even in the case in which antennas of a steering device are arranged in a one-dimensional form, thereby reducing the number of antennas required for two-dimensional optical scanning and facilitating commercialization. Although example embodiments have been described, the example embodiments are for illustrative purposes only, and those skilled in the art may make various modifications therefrom.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims.

What is claimed is:

1. A tunable laser source comprising:
a plurality of optical waveguides comprising a first waveguide, a second waveguide, a third waveguide, and a fourth waveguide;
at least three optical resonators provided between the plurality of optical waveguides and optically coupled to the plurality of optical waveguides, the at least three optical resonators having different lengths; and
at least one optical amplifier provided on at least one of the plurality of optical waveguides,
wherein a ratio of a first length of a first optical resonator of the at least three optical resonators to a second length of a second optical resonator of the at least three optical resonators is not an integer,
wherein the at least three optical resonators comprise:
a first ring resonator having a first circumference length;
a second ring resonator having a second circumference length that is greater than the first circumference length; and
a third ring resonator having a third circumference length that is greater than the second circumference length,
wherein the first ring resonator is between the first waveguide and the second waveguide, the second ring resonator is between the second waveguide and the third waveguide, the third ring resonator is between the third waveguide and the fourth waveguide,
wherein a first mirror is provided at the first waveguide and a second mirror is provided on the fourth waveguide, and
wherein the tunable laser source further comprises an optical delay line and at least one phase shifter, the first mirror, an optical amplifier among the at least one optical amplifier, the optical delay line, and the at least one phase shifter being provided at the first waveguide in that order toward the first ring resonator.

2. The tunable laser source of claim 1, wherein the first mirror and the second mirror comprise grating mirrors or Sagnac mirrors.

* * * * *